Jan. 26, 1971　　R. W. RIGBY　　3,558,993

ELECTRICAL COMPONENT ASSEMBLIES WITH IMPROVED PRINTED CIRCUIT CONSTRUCTION

Filed Aug. 27, 1968

INVENTOR

Ronald William Rigby

BY Glascock, Downing & Seebold

ATTORNEYS

United States Patent Office 3,558,993

Patented Jan. 26, 1971

3,558,993

ELECTRICAL COMPONENT ASSEMBLIES WITH IMPROVED PRINTED CIRCUIT CONSTRUCTION

Ronald William Rigby, Solihull, England, assignor to Joseph Lucas (Industries) Limited, Birmingham, England Filed Aug. 27, 1968, Ser. No. 755,691
Claims priority, application Great Britain, Sept. 1, 1967, 40,090/67
Int. Cl. H05k 1/04
U.S. Cl. 317—101 3 Claims

ABSTRACT OF THE DISCLOSURE

An electrical component assembly comprising a tile having circuits on both sides, a slide mounted on the tile and enclosed within a cover secured to the tile, connection between the circuits at opposite sides of the tile being made through drillings and the cover being secured to the tile at a region which is clear of circuits.

This invention relates to electrical component assemblies of the kind comprising a tile upon which is mounted one or more slides carrying electrical printed circuits and/or components, the or each slide being disposed within an enclosure defined by a cover, the tile having circuits printed thereon, portions of which are disposed in the enclosure for the, or each, slide, and electrical connection between the portions of the circuits on the tile and on the circuits and/or components on the, or each, side is achieved through interconnecting wires. Such assemblies will for convenience be referred to as being of the kind specified.

In hitherto proposed constructions, the tile printed circuits have extended across the portion of the face of the tile to which the cover is secured. It has been necessary to secure the cover to the tile by an electrically insulating material such as glass, the choice of such a material being dictated by the conditions under which the assembly is to operate. The use of glass as a seal has tended to lead the mixing of the metallic inks of the printed circuits with the glass, thus causing shorting between portions of the circuits.

The object of the invention is to provide an electrical component assembly of the kind specified in a form in which this disadvantage is overcome.

According to the present invention an electrical component assembly of the kind specified is characterized in that within the, or each, slide enclosure, there are portions of the printed circuits on the tile which are connected through holes in the tile with further portions of the same circuits on the opposite side of the tile, the region of the tile to which the cover is secured being clear of the electrical printed circuits.

The invention will now be described by way of example with reference to the accompanying drawings in which.

Figure 1:
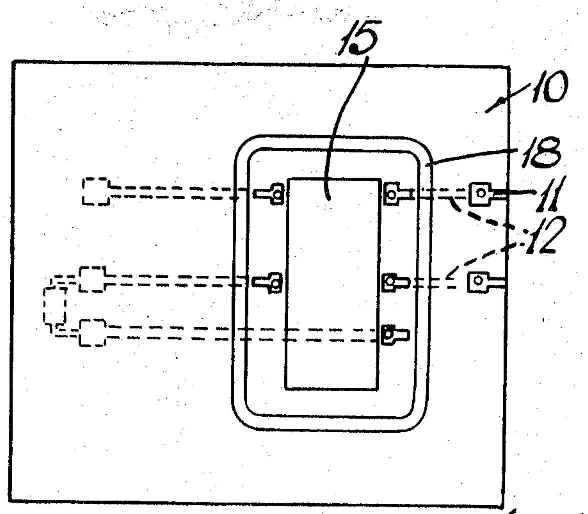
FIG. 1 is a plan view of a tile incorporating the present invention.

The electrical component assembly illustrated comprises a tile 10 formed from a ceramic material upon which are printed in a metallic ink, electrical circuits. Portions 11, 12 of these circuits are disposed at opposite sides of the tile 10 respectively.

Portions of the same circuits at opposite sides of the tile 10 are interconnected by a method which is the subject of our copending British patent application No. 47,245/66. By this method the printing at opposite sides of the tile occurs over regions at which there are drillings 13 through the tile, and by the application of suction to the opposite side of the tile during printing, the metallic ink tends to run through the drillings 13 so that an electrically conducting path is provided between the circuit portions on opposite sides of the tile.

Also mounted on the tile 10 is a slide 14 which may be formed from glass, and this may be secured in place by means of a metallized portion of the surface of the tile indicated at 15. Conveniently, the metallized portion 15 is of the same material as that used for the electrical circuits.

The slide 14 is provided with circuits (not illustrated) and there are connected with the circuits on the tile 10 by wires 16 welded or otherwise secured to the portions of the circuits.

Enclosing the slide 14 within an hermetically sealed enclosure is a cover 17, which, in this example, is made from metal and which is secured to the tile 10 by a metallized portion 18 on the tile, which can also be printed simultaneously with the circuits and with the metallized portion 15. It has, however, been found that it is desirable to provide a soldering or brazing material between the ink and the cover, this material having a lower melting point than the ink.

At the same or the opposite side of the tile 10 the printed circuits are connected to components such as that illustrated at 19, which are themselves secured in any convenient manner to the tile 10.

Figure 2:
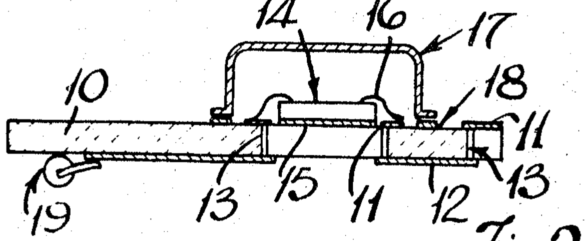
FIG. 2 is a cross-sectional side elevation view of the tile with components and a cover fixed thereto.

As illustrated, the portions 11, 12 of the printed circuits are so arranged that over the region at which the cover 17 is secured to the tile 10 by the metallized portion 18, there are no portions of the printed circuits. The portions 11 are disposed at opposite sides of the metallized portion 18 respectively, and there are drillings 13 at such opposite sides and a connecting portion 12 at the opposite side of the tile extends between the drillings 13. This is clearly illustrated in FIG. 2.

Figure 3:
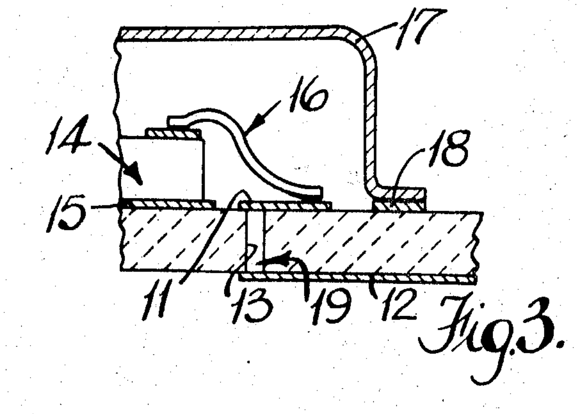
FIG. 3 is an enlarged cross-sectional view.

In order that the enclosure containing the slide 14 shell be completely sealed, it is necessary to fill the drillings 13 and FIG. 3 illustrates a plug 19 which is used for this purpose. Other arrangements for sealing the drillings 13 can, of course, be used.

In the method of constructing the printed circuit assembly, the tile is first formed and is provided with appropriately positioned drillings. Next the portions 11, 12 of the electrical printed circuits are applied by a silk screen process or other convenient printing process, and at the same time, or if desired, as a separate process, the metallized portions 15 and 18 can be applied. The printing process will result in interconnection of the portions 11, 12 of the printed circuits through the drillings 13. The drillings 13 are now plugged with short lengths of wire 19. The assembly is inserted into a furnace which is raised to a temperature at which the metallizing ink is fused to the tile.

The slide is now fixed in position upon the metallized portion 15 by brazing or soldering and the wires 16 are fitted to provide electrical connections between the tile printed circuits and the printed circuits upon the slide 14. The cover 17 is now placed over the slide 14 and its edges are engaged with the metallized portion 18. The assembly is again inserted into the furnace which is brought to a temperature at which the soldering or brazing material positioned on the metallized portion 18 will melt to a sufficient extent to cause the cover to adhere to the tile, and this is carried out in an inert or other controlled atmosphere, so that the enclosure containing the slide 14 is, when the assembly is completed, inert and sealed. Other components can subsequently be applied by similar process to the tile.

Having thus described my invention what I claim as new and desire to secure by Letters Patent is:

1. An electrical component assembly comprising a tile, a plurality of electrical printed circuits on the tile, at least one slide mounted on the tile, a cover secured to the tile and defining an enclosure for the slide, portions of the printed circuits on the surface of the tile adjacent to the slide and within said enclosure, wires joining the electrical components on the slide to said portions of the circuits, further portions of the same circuits on the same surface of the tile outside said enclosure, and still further portions of the same circuits on the opposite surface of the tile and joined to said portions and said further portions of the circuits through holes in the tile, whereby the area of the surface of the tile on which the cover is secured is free from printed circuits.

2. An electrical component assembly as claimed in claim 1 in which the cover is secured to the tile by a metallic substance.

3. An electrical component assembly as claimed in claim 2 in which the substance used to secure the cover to the tile is the same as that used for the printed circuits on the tile.

References Cited

UNITED STATES PATENTS

| | | | |
|---|---|---|---|
| 3,159,770 | 12/1964 | Longo | 317—101(C) |
| 3,262,023 | 7/1966 | Boyle | 317—101(C) |
| 3,283,060 | 11/1966 | Wiese | 317—101(C)X |
| 3,312,771 | 4/1967 | Hessinger et al. | 317—101(C)X |
| 3,339,117 | 8/1967 | Fisher | 317—101(C) |

ROBERT K. SCHAEFER, Primary Examiner

J. R. SCOTT, Assistant Examiner

U.S. Cl. X.R.

174—68.5